United States Patent
Hirai et al.

(10) Patent No.: US 9,854,710 B2
(45) Date of Patent: Dec. 26, 2017

(54) INFORMATION PROCESSING DEVICE AND CONTAINER FOR DATA CENTER

(71) Applicant: FUJITSU LIMITED, Kawasaki-shi, Kanagawa (JP)

(72) Inventors: Keita Hirai, Kawasaki (JP); Tsuyoshi So, Kawasaki (JP); Naofumi Kosugi, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/256,862

(22) Filed: Sep. 6, 2016

(65) Prior Publication Data

US 2017/0127573 A1    May 4, 2017

(30) Foreign Application Priority Data

Nov. 4, 2015  (JP) ................. 2015-216800

(51) Int. Cl.
*H05K 7/20* (2006.01)
*F24F 3/14* (2006.01)
*H01L 23/473* (2006.01)

(52) U.S. Cl.
CPC .......... *H05K 7/20736* (2013.01); *F24F 3/14* (2013.01); *F24F 2003/144* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236

See application file for complete search history.

(56) References Cited

U.S. PATENT DOCUMENTS

| | | | |
|---|---|---|---|
| 2002/0021557 A1* | 2/2002 | Ishimine ................. | G06F 1/181 361/720 |
| 2005/0063158 A1* | 3/2005 | Thiele ................. | F28D 15/0266 361/700 |
| 2007/0095507 A1* | 5/2007 | Henderson ............ | F28D 15/043 165/104.26 |

(Continued)

FOREIGN PATENT DOCUMENTS

| | | |
|---|---|---|
| JP | 2010-257431 | 11/2010 |
| JP | 2013-030028 | 2/2013 |
| WO | 2015/114742 | 8/2015 |

*Primary Examiner* — Anthony Haughton
*Assistant Examiner* — Razmeen Gafur
(74) *Attorney, Agent, or Firm* — Fujitsu Patent Center

(57) ABSTRACT

An information processing device includes: one or more information processing device main bodies; a first heat exchanger configured to cool air to be introduced into the one or more information processing device main bodies; an air blower configured to introduce the air into the one or more information processing device main bodies; an evaporator through which discharged air discharged from the one or more information processing device main bodies passes; a receiving pan configured to receive water generated by dew condensation in the first heat exchanger; and a water supply member configured to supply the water in the receiving pan to the evaporator.

20 Claims, 10 Drawing Sheets

(56) References Cited

U.S. PATENT DOCUMENTS

| | | | |
|---|---|---|---|
| 2007/0242438 A1* | 10/2007 | Belits | F28D 15/0266 361/700 |
| 2007/0267182 A1* | 11/2007 | Rusch | F28D 15/0241 165/104.33 |
| 2007/0284093 A1* | 12/2007 | Bhatti | F28D 15/0266 165/104.33 |
| 2009/0080173 A1* | 3/2009 | Porter | H05K 7/20827 361/831 |
| 2010/0071881 A1* | 3/2010 | Murer | B64D 13/00 165/104.33 |
| 2012/0140404 A1* | 6/2012 | Peterson | G06F 1/20 361/679.47 |
| 2012/0218711 A1* | 8/2012 | Kashirajima | F25B 25/00 361/700 |
| 2012/0313657 A1* | 12/2012 | Nakamura | G06F 1/20 324/750.09 |
| 2013/0146273 A1* | 6/2013 | Chester | H05K 7/20772 165/287 |
| 2013/0208421 A1* | 8/2013 | Chester | H05K 7/20772 361/699 |
| 2014/0049917 A1* | 2/2014 | Campbell | F28D 1/0471 361/701 |
| 2014/0055949 A1* | 2/2014 | Campbell | F28D 1/0471 361/691 |
| 2014/0126142 A1* | 5/2014 | Dean | G06F 1/20 361/679.47 |
| 2014/0198453 A1* | 7/2014 | Zhang | H01L 23/473 361/699 |
| 2014/0211418 A1* | 7/2014 | Arreola | H05K 7/20172 361/695 |
| 2014/0211531 A1* | 7/2014 | Yamashita | H02M 7/003 363/141 |
| 2014/0260398 A1* | 9/2014 | Kozubal | F25B 15/00 62/271 |
| 2014/0293542 A1* | 10/2014 | Vetrovec | H01L 23/473 361/699 |
| 2014/0313669 A1* | 10/2014 | Babish | H01L 23/473 361/699 |
| 2014/0328022 A1* | 11/2014 | Walch | H05K 5/069 361/701 |
| 2014/0362527 A1* | 12/2014 | Best | G06F 1/20 361/679.53 |
| 2015/0062806 A1* | 3/2015 | Shelnutt | H05K 7/203 361/679.53 |

* cited by examiner

FIG. 4

| AIR TEMPERATURE (°C) | RELATIVE HUMIDITY (%RH) | | | | | | | | | | DEW POINT (°C) |
|---|---|---|---|---|---|---|---|---|---|---|---|
| | 5% | 10% | 20% | 30% | 40% | 50% | 60% | 70% | 80% | 90% | 100% |
| 60 | 7 | 17 | 29 | 36 | 42 | 46 | 49 | 52 | 55 | 57 | 60 |
| 55 | 4 | 14 | 25 | 32 | 37 | 41 | 45 | 48 | 50 | 53 | 55 |
| 50 | 0 | 10 | 21 | 28 | 33 | 37 | 40 | 43 | 46 | 48 | 50 |
| 45 | −3 | 6 | 17 | 23 | 28 | 32 | 35 | 38 | 41 | 43 | 45 |
| 40 | −6 | 3 | 13 | 19 | 24 | 28 | 31 | 34 | 36 | 38 | 40 |
| 35 | −10 | −1 | 9 | 15 | 19 | 23 | 26 | 29 | 31 | 33 | 35 |
| 30 | −13 | −5 | 5 | 10 | 15 | 18 | 21 | 24 | 26 | 28 | 30 |
| 25 | −16 | −8 | 1 | 6 | 10 | 14 | 17 | 19 | 21 | 23 | 25 |
| 20 | −19 | −12 | −3 | 2 | 6 | 9 | 12 | 14 | 16 | 18 | 20 |
| 15 | −22 | −15 | −7 | −2 | 2 | 5 | 7 | 10 | 12 | 13 | 15 |
| 10 | −25 | −19 | −11 | −6 | −3 | 0 | 3 | 5 | 7 | 8 | 10 |
| 5 | −28 | −22 | −15 | −11 | −7 | −4 | −2 | 0 | 2 | 3 | 5 |
| 0 | −32 | −25 | −18 | −14 | −11 | −8 | −6 | −4 | −3 | −1 | 0 |

FIG. 6

| | DATA CENTER 1 | DATA CENTER 2 |
|---|---|---|
| TEMPERATURE OF INSTALLATION ENVIRONMENT OF DATA CENTER | 40°C | 40°C |
| DEW POINT OF INSTALLATION ENVIRONMENT OF DATA CENTER | 30°C | 30°C |
| RELATIVE HUMIDITY OF INSTALLATION ENVIRONMENT OF DATA CENTER | APPROXIMATELY 60%RH | APPROXIMATELY 60%RH |
| ENVIRONMENTAL TEMPERATURE IN DATA CENTER | 35°C | 25°C |
| DEW POINT IN DATA CENTER | 30°C | 15°C |
| RELATIVE HUMIDITY IN DATA CENTER | APPROXIMATELY 75%RH | APPROXIMATELY 50%RH |
| SERVER POWER (EXCEPT FAN POWER) | 200 kW | 200 kW |
| COOLING FAN POWER OF SERVER | 20 kW | 10 kW |
| AIR CONDITIONING POWER IN DATA CENTER | 22 kW | 0 kW |
| COOLING WATER SUPPLY PUMP POWER IN DATA CENTER | 0 kW | 5 kW |
| TOTAL POWER IN DATA CENTER | 242 kW | 215 kW |
| POWER REDUCTION EFFECT | − | 27 kW |

INFORMATION PROCESSING DEVICE AND CONTAINER FOR DATA CENTER

CROSS-REFERENCE TO RELATED APPLICATION

This application is based upon and claims the benefit of priority of the prior Japanese Patent Application No. 2015-216800, filed on Nov. 4, 2015, the entire contents of which are incorporated herein by reference.

FIELD

The embodiment discussed herein is related to an information processing device and a container for a data center.

BACKGROUND

Accompanying the development of an advanced information society, a large amount of information is dealt with by information processing devices such as servers.

Examples of related art are disclosed in WO 2015/114742, Japanese Laid-open Patent Publication No. 2010-257431, and Japanese Laid-open Patent Publication No. 2013-30028.

SUMMARY

According to an aspect of the embodiments, an information processing device includes: one or more information processing device main bodies; a first heat exchanger configured to cool air to be introduced into the one or more information processing device main bodies; an air blower configured to introduce the air into the one or more information processing device main bodies; an evaporator through which discharged air discharged from the one or more information processing device main bodies passes; a receiving pan configured to receive water generated by dew condensation in the first heat exchanger; and a water supply member configured to supply the water in the receiving pan to the evaporator.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 illustrates one example of a dew point table that is used for obtaining a dew point (° C.) from a temperature of air (air temperature: ° C.) and relative humidity (% RH);

FIG. 6 illustrates one example of a comparison between data centers;

DESCRIPTION OF EMBODIMENT

In data centers and server rooms (hereinafter, those will simply be referred to as "data center"), a large number of racks are placed in a room, and plural servers are housed in each of the racks. Jobs are allocated to the servers in an organized manner, and a large amount of jobs is efficiently processed.

For example, electronic components such as central processing units (CPUs) that are used for the servers generate a large amount of heat during operation. In a case where the temperatures of those electronic components exceed allowable upper limit temperatures, problems such as failure, malfunction, and degradation of a processing ability are caused. Thus, in the data center, air cooled by an air conditioning unit (packaged air conditioner) or the like is supplied into the server, and the temperatures of the electronic components in the server are thereby caused not to exceed the allowable upper limit temperatures.

For example, in the data center, outside air is introduced into the room to cool the server, and the power used for cooling is thereby reduced. In this case, in a case where the outside air is highly humid, dew condensation may occur in the server and cause failure. Thus, in a case where the outside air is introduced into the room, the humidity as well as the temperature is managed.

For example, the data centers may be placed in countries of tropical climate such as Thailand. Those countries are in environments with high temperature and high humidity, and the cost requested for temperature management and humidity management may be huge.

Figure 1:
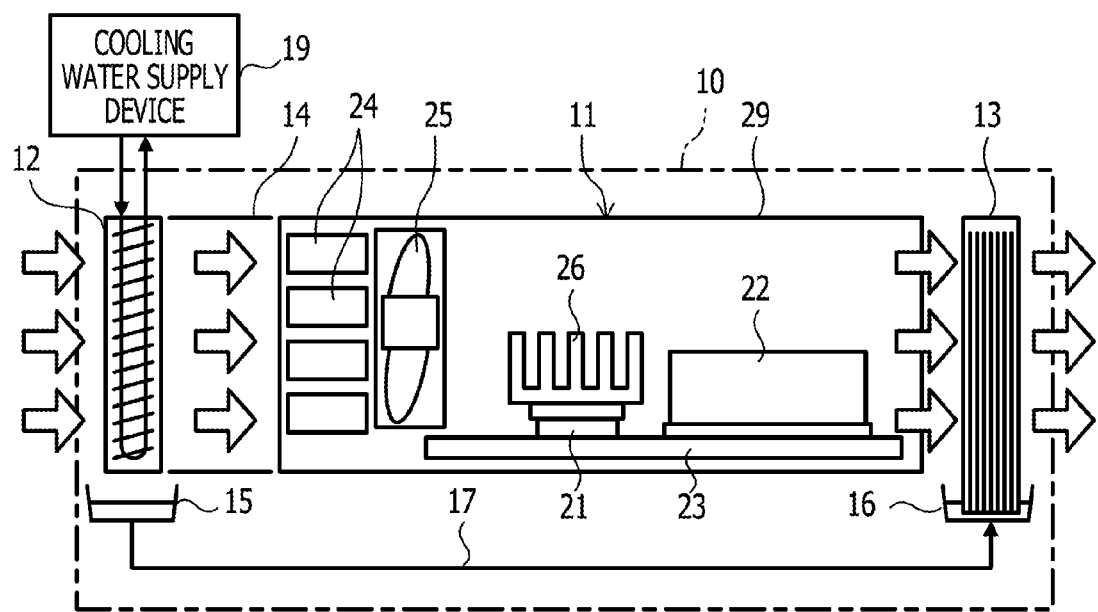
FIG. 1 illustrates one example of an information processing device.

FIG. 1 illustrates one example of an information processing device. For example, the information processing device illustrated in FIG. 1 may be a server. The arrows in FIG. 1 indicate the direction of an air flow.

An information processing device 10 has an information processing device main body 11, a heat exchanger 12, for example, a first heat exchanger, and an evaporator 13. The heat exchanger 12 is arranged on one surface (air intake surface) side of the information processing device main body 11, and the evaporator 13 is arranged on the opposite side (air discharging surface side) across the information processing device main body 11 from the heat exchanger 12. A duct 14 is provided between the heat exchanger 12 and the information processing device main body 11 such that the air that passes through the heat exchanger 12 enters an inside of the information processing device main body 11.

A receiving pan 15 is arranged below the heat exchanger 12. Because cooling water (cooling medium) at a low temperature is supplied from a cooling water supply device 19 to the heat exchanger 12, dew condensation may occur in the heat exchanger 12. Water from the dew condensation in the heat exchanger 12 drops to the receiving pan 15.

A water storage pan 16 is arranged below the evaporator 13. The receiving pan 15 communicates with the water storage pan 16 by a flow channel 17, and the water in the receiving pan 15 moves to the water storage pan 16 through the flow channel 17. As the flow channel 17, a resin pipe may be used, for example. The water storage pan 16 and the flow channel 17 may be examples of water supply members.

The information processing device main body 11 has a circuit board 23, hard disk drives (HDDs) 24, and an air blower (cooling fan) 25, and a housing 29 that houses those components. A CPU 21, a memory 22, and other electronic components are installed in the circuit board 23.

A heat sink 26 is mounted on the CPU 21. The CPU 21 and the heat sink 26 are thermally connected together via silicone grease or the like arranged therebetween. Thus, the heat generated by the CPU 21 is quickly transmitted to the heat sink 26.

All of the HDD 24, the CPU 21, and the memory 22 may be examples of heat generating components. The HDDs 24 are arranged between an air intake surface of the housing 29 and the air blower 25.

Figure 2:
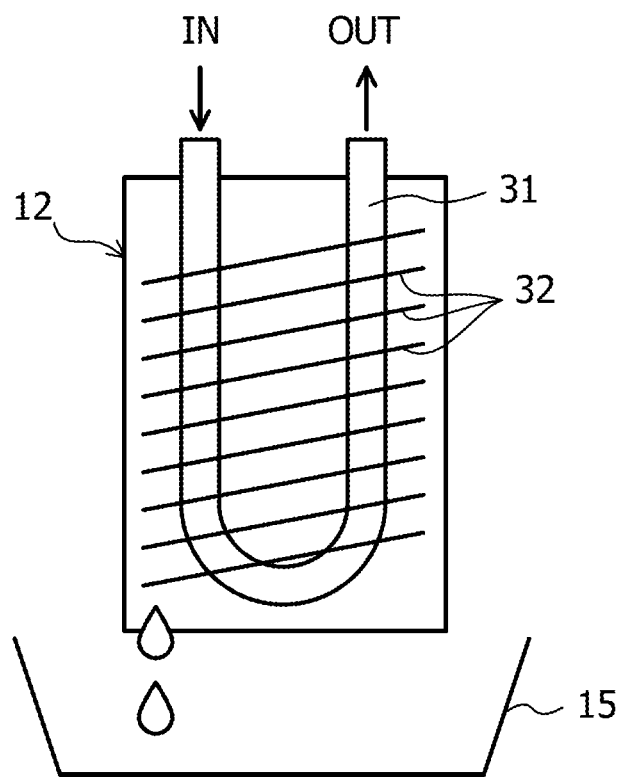
FIG. 2 illustrates one example of a structure of a heat exchanger.

FIG. 2 illustrates one example of a structure of a heat exchanger. The heat exchanger illustrated in FIG. 2 may be the heat exchanger 12 illustrated in FIG. 1. As illustrated in FIG. 2, the heat exchanger 12 has a cold water pipe 31 and a large number of fins 32 that are arranged along the longitudinal direction of the cold water pipe 31. The cooling water (cooling medium) is supplied from the cooling water supply device 19 (see FIG. 1) placed in an outdoor place, for example, to the cold water pipe 31. Although the kind of the cooling water supply device 19 is not limited, for example, an air-cooled chiller may be used as the cooling water supply device 19. The temperature of the cooling water supplied to the cold water pipe 31 may appropriately be set. For example, the temperature of the cooling water supplied to the cold water pipe 31 may be about 10° C. to 15° C.

Figure 3:
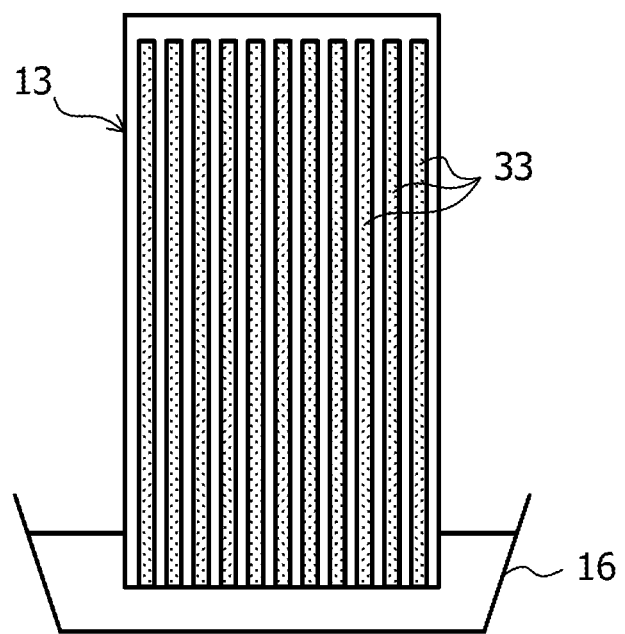
FIG. 3 illustrates one example of a structure of an evaporator.

FIG. 3 illustrates one example of a structure of an evaporator. The evaporator illustrated in FIG. 3 may be the evaporator 13 illustrated in FIG. 1.

As illustrated in FIG. 3, the evaporator 13 includes a large number of capillaries 33. The water in the water storage pan 16 moves up in the capillaries 33 by capillary action. A large number of fine pores are provided in a circumferential surface of each of the capillaries 33, and water evaporates from the capillaries 33 when air passes through an inside of the evaporator 13.

For example, the capillaries 33 may be used for the evaporator 13. Instead of the capillaries 33, a rod-shaped member, a bundle of fibers, or the like that includes a porous medium capable of pumping up water by capillary action may be used. For example, a porous medium may be arranged in the evaporator 13, and a small pump may be used to supply water in the receiving pan 15 or the water storage pan 16 to the porous medium.

When the air blower 25 operates, air is introduced to the information processing device 10 via the heat exchanger 12. For example, the outside air at a temperature of 50° C. and at humidity (relative humidity: the same will apply hereinafter) of 60% RH may be introduced into the information processing device 10.

The cooling water is supplied from the cooling water supply device 19 to the heat exchanger 12. For example, the temperature may decrease to 25° C. when the outside air passes through the heat exchanger 12.

FIG. 4 illustrates one example of a dew point table that is used for obtaining a dew point (° C.) from the temperature of air (air temperature: ° C.) and the relative humidity (% RH).

As illustrated in FIG. 4, the dew point is 40° C. in a case where the temperature is 50° C. and the relative humidity is 60% RH. Thus, in a case where the temperature of air (outside air) decreases to 25° C., water in the air condenses in the heat exchanger 12, and water drops are attached on surfaces of the fins 32.

As illustrated in FIG. 2, because the fin 32 is inclined, the water drops that become large to some extent on the surface of the fin 32 slip down from the fin 32 and drops to the receiving pan 15. The water that drops to the receiving pan 15 moves to the water storage pan 16 through the flow channel 17.

As indicated by arrows in FIG. 1, the air that passes through the heat exchanger 12 enters the inside of the information processing device main body 11 through an inside of the duct 14. The air cools the HDDs 24, further passes through the air blower 25, and cools the CPU 21 connected with the heat sink 26, the memory 22, and so forth. Here, because the temperature of the air rises by cooling the HDDs 24, the CPU 21, the memory 22, and so forth, the humidity of the air decreases. Thus, dew condensation may not occur in the information processing device main body 11.

The air whose temperature rises by cooling the HDDs 24, the CPU 21, and so forth passes through the evaporator 13 from the air discharging surface of the information processing device main body 11 and is discharged to the outside.

Because the air that enters the evaporator 13 has a high temperature and low humidity, water evaporates from the capillaries 33 when the air passes through the evaporator 13. When water evaporates, the temperature of a periphery decreases due to the heat of evaporation. Thus, the temperature of the air decreases by passing through the evaporator 13, and the humidity of the air rises.

Figure 5A:
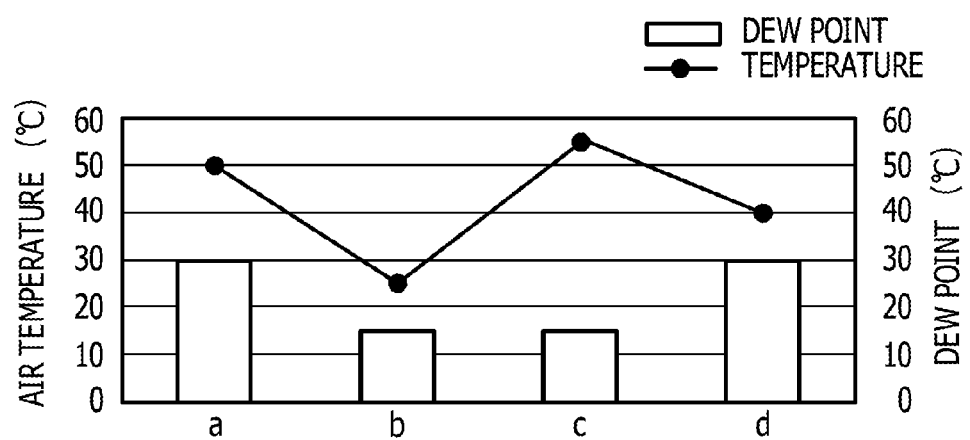
FIG. 5A illustrates one example of a change of the temperature of the air inside and outside of the information processing device.
Figure 5B:
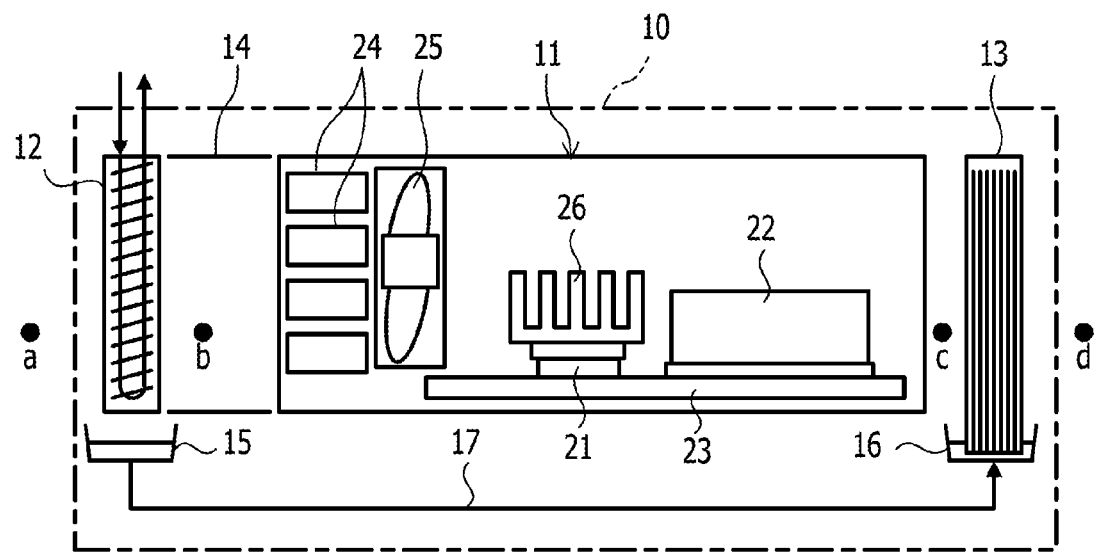
FIG. 5B illustrates examples of positions of a to d in FIG. 5A.

FIG. 5A illustrates one example of a change of the temperature of the air inside and outside of the information processing device. FIG. 5B illustrates examples of positions of a to d in FIG. 5A.

As illustrated in FIGS. 5A and 5B, the temperature of the air that is yet to enter the information processing device 10 (the temperature in a position a) is 50° C., and the dew point in this case is 30° C. The temperature of the air decreases and water is removed by dew condensation when the air passes through the heat exchanger 12. Thus, the temperature of the air that enters the inside of the information processing device main body 11 (the temperature in a position b) becomes 25° C., and the dew point decreases to 15° C.

The temperature of the air rises by cooling the HDDs 24, the CPU 21, the memory 22, and so forth. Thus, the temperature of the air that is discharged from the information processing device main body 11 (the temperature in a position c) becomes about 55° C. However, the dew point is 15° C. because the amount of water that is contained in the air does not change.

When the air passes through the evaporator 13, because the water evaporates, the temperature of the air decreases, and the dew point rises. In FIG. 5A, the temperature of the air that has passed through the evaporator 13 (the temperature in a position d) is 40° C., and the dew point is 30° C.

The temperature of the air that is introduced into the information processing device main body 11 is reduced to the temperature of an installation environment or lower. Thus, the information processing device 10 may be used in an environment with high temperature and high humidity.

For example, even in a use environment in which the room temperature is 50° C. and the dew point is 40° C. (the humidity is approximately 60% RH), the temperature of the air introduced into the information processing device main body 11 is reduced to about 25° C., and the dew point is reduced to about 15° C. (humidity of approximately 50%

RH). Thus, the region in which information processing facilities such as data centers may be placed may significantly be enlarged.

Air at a low temperature is introduced into the information processing device main body 11, and the load to the air blower 25 is thus reduced. As a result, the power consumption of the air blower 25 may be reduced, and the noise due to the air blower 25 may also be reduced.

For example, in a case of placement in an environment in which the room temperature is 35° C., in the information processing device 10, the power consumption of the air blower 25 becomes about ½ compared to other information processing devices, and the noise may be reduced by 5 dB or higher.

The problems with the temperature and humidity of the air introduced into the information processing device main body 11 are solved. Accordingly, the above techniques may be applied to data centers of an outside air introduction type. In such a case, an air conditioning unit may not be placed in a room, and the power consumption amount of the data center may thus be reduced.

The air blower 25 may be provided in the information processing device main body 11, or the air blower 25 may be provided outside of the information processing device main body 11.

In a case where the humidity of the air introduced into the information processing device 10 is high, dew condensation occurs in the heat exchanger 12. In a case where the humidity of the air introduced into the information processing device 10 is low, dew condensation does not occur in the heat exchanger 12. In such a case also, because the temperature of the air that passes through the heat exchanger 12 decreases to a temperature lower than the temperature of the installation environment, failure and malfunction of the information processing device 10 may be avoided, and the effects of reduction in the noise due to air blower 25, reduction in the power consumption, and so forth may be obtained.

FIG. 6 illustrates one example of a comparison between data centers. FIG. 6 illustrates one example of the results of test calculation of the power consumption of a data center 1 that uses the above-described information processing device 10 and the power consumption of a data center 2 that uses an information processing device which does not have a heat exchanger, an evaporator, or the like. In the data center 2, the air that is cooled by an air conditioning unit (power consumption of 22 kW) placed in a room is supplied to the information processing device.

One hundred information processing devices (servers) may be placed in each of the data centers 1 and 2. In the data center 1, a pump that distributes cooling water to each of the information processing devices is used, and the power consumption of the pump is set to 5 kW.

As illustrated in FIG. 6, in a case where the temperature of the installation environment of each of the data centers is 40° C. and the dew point of the installation environment is 30° C., power consumption of approximately 27 kW is reduced in the data center 1 compared to the data center 2. The cost requested for temperature management and humidity management may be reduced in the data center 1 compared to the data center 2.

Figure 7:
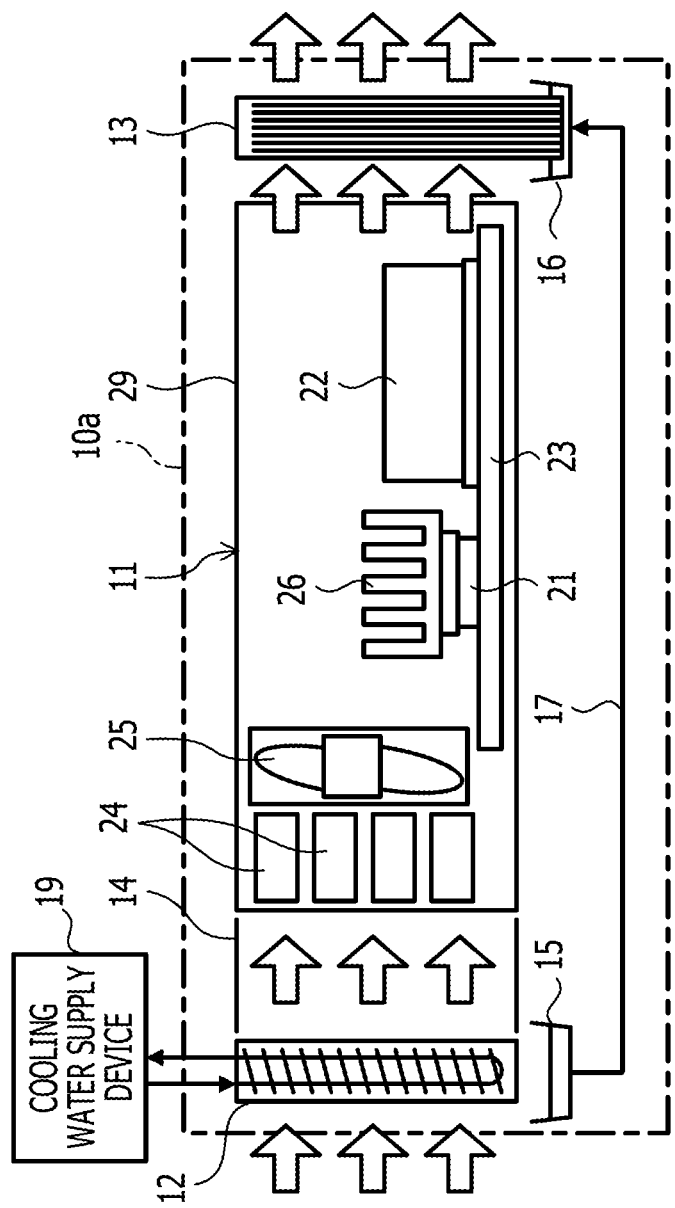
FIG. 7 illustrates one example of an information processing device.

FIG. 7 illustrates one example of an information processing device. In FIG. 7, the same reference numerals will be given to the same components as FIG. 1, and detailed descriptions thereof may not be made.

In an information processing device 10a, a second heat exchanger 12a is arranged between the first heat exchanger 12 and the information processing device main body 11. The duct 14 is arranged between the first heat exchanger 12 and the second heat exchanger 12a, and a duct 14a is arranged between the second heat exchanger 12a and the air intake surface of the information processing device main body 11.

As illustrated in FIG. 7, cooling water supplied from the cooling water supply device 19 passes through an inside of the first heat exchanger 12, thereafter passes through an inside of the second heat exchanger 12a, and returns to the cooling water supply device 19.

When the air blower 25 operates, air is introduced to the information processing device 10a via the first heat exchanger 12. For example, the outside air at a temperature of 50° C. and at humidity of 60% RH may be introduced into the information processing device 10a.

When the air passes through the first heat exchanger 12, dew condensation occurs because the air is cooled by the cooling water that passes through the first heat exchanger 12, and water drops are attached on the surfaces of the fins 32 in the first heat exchanger 12. When the water drops attached on the fins 32 become large to some extent, the water drops drop to the receiving pan 15. The water that drops to the receiving pan 15 moves to the water storage pan 16 through the flow channel 17.

The air that passes through the first heat exchanger 12 next passes through the second heat exchanger 12a. The water in the air that enters the second heat exchanger 12a is already removed to some extent by the first heat exchanger 12. Because the temperature of the cooling water supplied to the second heat exchanger 12a rises by passing through the first heat exchanger 12, dew condensation may not occur in the second heat exchanger 12a.

The air that passes through the second heat exchanger 12a enters the inside of the information processing device main body 11. The air cools the HDDs 24, the CPU 21 on which the heat sink 26 is mounted, the memory 22, and so forth.

The air whose temperature rises by cooling the HDDs 24, the CPU 21, the memory 22, and so forth passes through the evaporator 13 from the air discharging surface of the information processing device main body 11 and is discharged to the outside.

Because the air that enters the evaporator 13 has a high temperature and low humidity, water evaporates from the capillaries 33 (see FIG. 3) when the air passes through the evaporator 13. Because the temperature of a periphery decreases due to the heat of evaporation when water evaporates, the temperature of the air decreases by passing through the evaporator 13, and the humidity of the air rises.

Also in the information processing device 10a illustrated in FIG. 7, similar effects to the information processing device 10 illustrated in FIGS. 1 to 3 may be obtained. In FIG. 7, the temperature of the air that enters the inside of the information processing device main body 11 is further reduced by the second heat exchanger 12a compared to the information processing device 10 illustrated in FIG. 1. Accordingly, the electronic components such as the HDDs 24, the CPU 21, and the memory 22 may more certainly be cooled.

Figure 8:
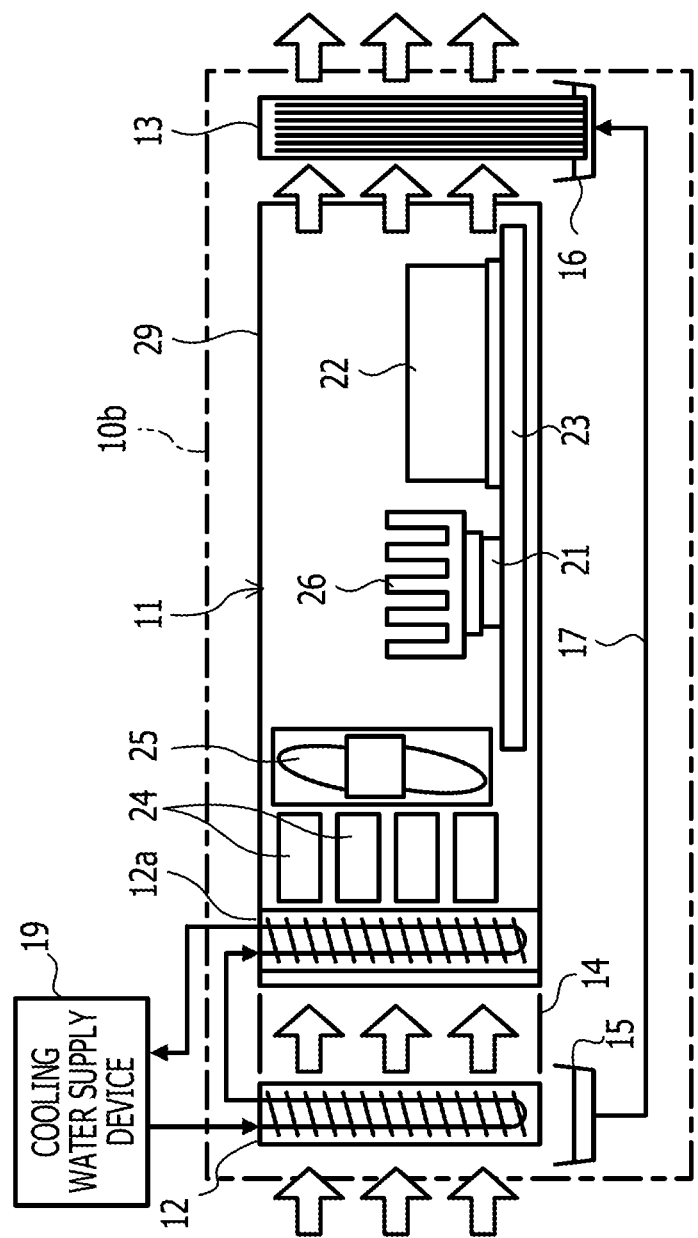
FIG. 8 illustrates one example of an information processing device.

FIG. 8 illustrates one example of an information processing device. In FIG. 8, the same reference numerals will be given to the same components as FIG. 1, and detailed descriptions thereof may not be made.

In an information processing device 10b illustrated in FIG. 8, the second heat exchanger 12a is arranged between the air intake surface of the information processing device main body 11 and the HDDs 24. Cooling water supplied from the cooling water supply device 19 passes through the inside of the first heat exchanger 12, thereafter passes through the inside of the second heat exchanger 12a, and returns to the cooling water supply device 19.

The operation of the information processing device 10b illustrated in FIG. 8 may be substantially the same as the operation of the information processing device 10a illustrated in FIG. 7.

In FIG. 8, because the second heat exchanger 12a is arranged in the vicinity of the air blower 25, a sufficient air flow amount may be secured even in a case where the density of fins of the second heat exchanger 12a is increased. Accordingly, a cooling ability of the second heat exchanger 12a is improved, and the HDDs 24, the CPU 21, the memory 22, and so forth may more certainly be cooled.

Figure 9:
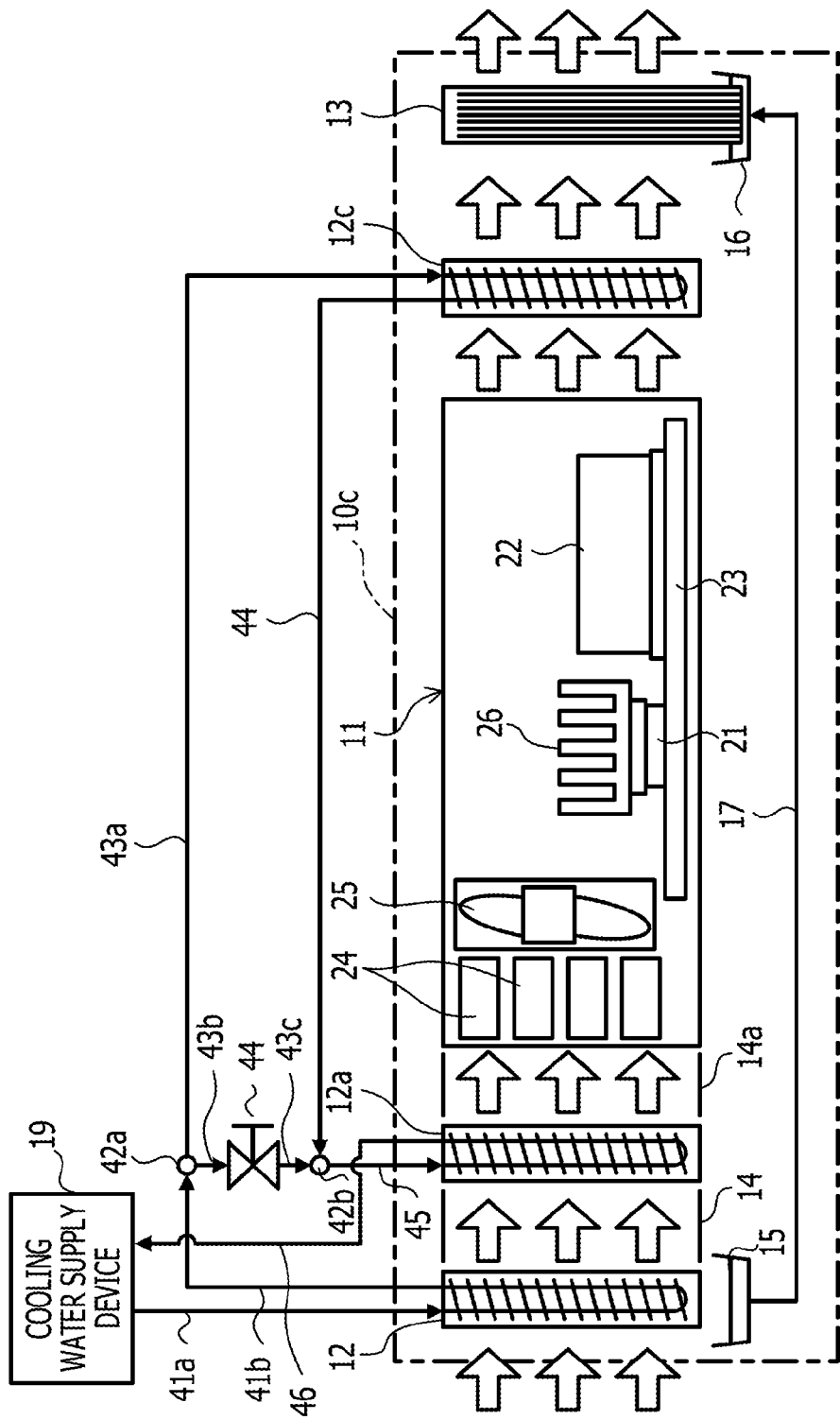
FIG. 9 illustrates one example of an information processing device.

FIG. 9 illustrates one example of an information processing device. In FIG. 9, the same reference numerals will be given to the same components as FIG. 1, and detailed descriptions thereof may not be made.

In an information processing device 10c illustrated in FIG. 9, the second heat exchanger 12a is arranged between the first heat exchanger 12 and the information processing device main body 11. A third heat exchanger 12c is arranged between the air discharging surface of the information processing device main body 11 and the evaporator 13. The structures of the second heat exchanger 12a and the third heat exchanger 12c may be substantially the same as the structure of the first heat exchanger 12 (see FIG. 2).

The duct 14 is arranged between the first heat exchanger 12 and the second heat exchanger 12a, and the duct 14a is arranged between the second heat exchanger 12a and the air intake surface of the information processing device main body 11.

As illustrated in FIG. 9, a cooling water supply port of the cooling water supply device 19 is connected with a cooling water inlet of the first heat exchanger 12 via piping 41a. A cooling water outlet of the first heat exchanger 12 is connected with a cooling water inlet of a bifurcation 42a via piping 41b.

A first cooling water outlet of the bifurcation 42a is connected with a cooling water inlet of a valve 44 via piping 43b, and a cooling water outlet of the valve 44 is connected with a first cooling water inlet of a junction 42b via piping 43c.

A second cooling water outlet of the bifurcation 42a is connected with a cooling water inlet of the third heat exchanger 12c via piping 43a. Further, a cooling water outlet of the third heat exchanger 12c is connected with a second cooling water inlet of the junction 42b via piping 44.

A cooling water outlet of the junction 42b is connected with a cooling water inlet of the second heat exchanger 12a via piping 45. Further, a cooling water outlet of the second heat exchanger 12a is connected with a cooling water inlet of the cooling water supply device 19 via piping 46.

A pipeline of the cooling water is formed with the pieces of piping 41a, 41b, 43a, 43b, 43c, 44, 45, and 46, the bifurcation 42a, and the junction 42b.

In FIG. 9 also, the air introduced into the information processing device main body 11 is cooled by the first heat exchanger 12 and the second heat exchanger 12a. The air that has cooled the HDDs 24, the CPU 21, the memory 22, and so forth in the information processing device main body 11 is discharged to the outside of the information processing device 10c via the third heat exchanger 12c and the evaporator 13.

The cooling water at a temperature of 10° C. to 15° C., for example, is supplied from the cooling water supply device 19 to the first heat exchanger 12. Thus, in a case where the humidity of the air introduced into the information processing device 10c is high, dew condensation occurs in the first heat exchanger 12, and water drops to the receiving pan 15. The water that drops to the receiving pan 15 moves to the water storage pan 16 through the flow channel 17, similarly to the information processing device 10 illustrated in FIGS. 1 to 3, and evaporates from the evaporator 13.

The cooling water that leaves the first heat exchanger 12 is bifurcated at the bifurcation 42a, a portion thereof passes through an inside of the third heat exchanger 12c and moves to the junction 42b, and the remaining portion moves from the bifurcation 42a, through the valve 44, and to the junction 42b. The cooling water that moves to the junction 42b through the valve 44 joins the cooling water that moves to the junction 42b through the inside of the third heat exchanger 12c, and the cooling water joined together is supplied to the second heat exchanger 12a.

Accordingly, a temperature T3 of the cooling water supplied to the second heat exchanger 12a is a temperature between a temperature T1 of the cooling water that leaves the first heat exchanger 12 and a temperature T2 of the cooling water that leaves the third heat exchanger 12c (T1≤T3≤T2). The temperature T3 of the cooling water supplied to the second heat exchanger 12a may be adjusted by the opening of the valve 44.

In FIG. 8, because the cooling water that leaves the first heat exchanger 12 is immediately supplied to the second heat exchanger 12a, the temperature of the air supplied to the information processing device main body 11 may be lower than an appropriate range. In FIG. 9, a portion of waste heat that is discharged from the information processing device main body 11 is collected by the third heat exchanger 12c, and the temperature of the cooling water supplied to the second heat exchanger 12a is thereby adjusted. Thus, the air at a temperature in the appropriate range may be supplied to the information processing device main body 11.

Figure 10:
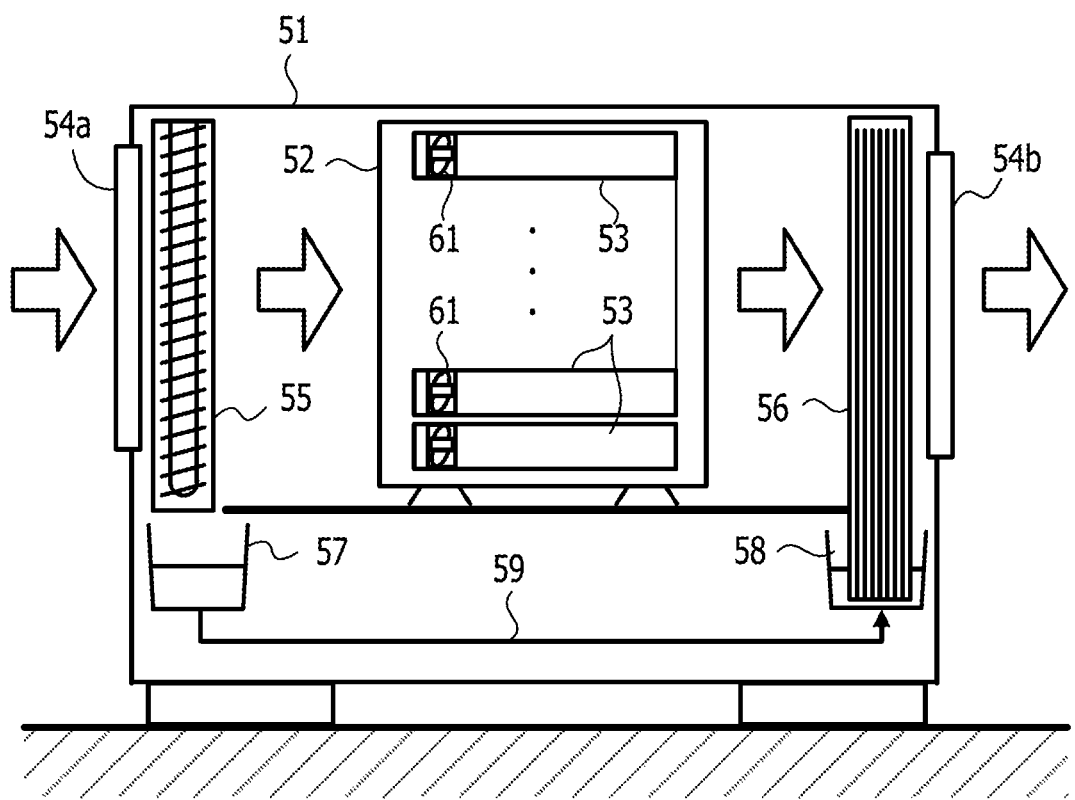
FIG. 10 illustrates one example of an information processing device.

FIG. 10 illustrates one example of an information processing device. In FIG. 10, the information processing device is applied to a container type data center.

As illustrated in FIG. 10, one or plural racks 52 are arranged in a container 51. Plural servers 53 are arranged in the height direction in the rack 52.

An air intake port 54a and a heat exchanger (first heat exchanger) 55 are provided on one side of the container 51, and an air discharge port 54b and an evaporator 56 are provided on the other side. A receiving pan 57 is arranged below the heat exchanger 55, a water storage pan 58 is arranged below the evaporator 56, and the receiving pan 57 communicates with the water storage pan 58 by a flow channel 59.

The heat exchanger 55 is provided with a cold water pipe and fins (see FIG. 2), and the cooling water is supplied from a cooling water supply device (see FIG. 1). The evaporator 56 is provided with capillaries (see FIG. 3), and the water in the water storage pan 58 moves up in the capillaries by capillary action. A porous medium may be arranged in the evaporator 56, and a small pump may be used to supply water from the receiving pan 57 or the water storage pan 58 to the porous medium.

An air blower 61 and a circuit board (not illustrated) in which electronic components such as a CPU are installed are housed in each of the servers 53 housed in the rack 52.

When the air blower 61 operates, air (outside air) is introduced into the container 51 through the air intake port 54a as indicated by an arrow in FIG. 10. For example, the air whose temperature is 50° C. and dew point is 40° C. (the humidity is approximately 60% RH) may be introduced into the container 51.

The air introduced into the container 51 through the air intake port 54a is cooled when the air passes through the heat exchanger 55, and dew condensation occurs in the heat exchanger 55. The water that is produced by the dew condensation drops to the receiving pan 57 and moves to the water storage pan 58 through the flow channel 59.

For example, the temperature of the air that has passed through the heat exchanger 55 may be 25° C., and the dew point may be 15° C. (the humidity may be approximately 50% RH). The air cooled by the heat exchanger 55 enters an inside of the rack 52 and cools the electronic components in the servers 53.

The air whose temperature rises by cooling the electronic components passes through the evaporator 56 and is discharged to the outside through the air discharge port 54b. When the air passes through the evaporator 56, the water in the evaporator 56 evaporates, the temperature of the air decreases, and the humidity rises.

In the information processing device illustrated in FIGS. 1, 7, and 8, one heat exchanger 12 and one evaporator 13 are arranged for each of the information processing devices. In FIG. 10, one heat exchanger 55 and one evaporator 56 are arranged for the plural information processing devices (the servers 53). Thus, the numbers of the receiving pans, the water storage pans, the flow channels, and so forth may be reduced compared to the information processing devices that are illustrated in FIGS. 1 to 3, 7, and 8.

The above-described container type data center may be placed in regions with high temperature and high humidity, request a short construction period, and thus significantly reduce the power that is requested for cooling the information processing devices.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An information processing device comprising:
   one or more information processing device main bodies;
   a first heat exchanger configured to cool air to be introduced into the one or more information processing device main bodies;
   an air blower configured to introduce the air into the one or more information processing device main bodies;
   an evaporator through which discharged air discharged from the one or more information processing device main bodies passes;
   a receiving pan configured to receive water generated by dew condensation in the first heat exchanger; and
   a water supply member configured to supply the water in the receiving pan to the evaporator,
   the evaporator includes:
      a water storage pan configured to receive the water from the receiving pan; and
      a plurality of capillaries configured to pump up water in the water storage pan by capillary action, each of the plurality of capillaries having a plurality of pores in a circumferential surface of the respective capillaries.

2. The information processing device according to claim 1, wherein the one or more information processing device main bodies include a heat generating component configured to generate heat based on an operation.

3. The information processing device according to claim 1, wherein cooling water at an environmental temperature or lower is supplied from a cooling water supply device to the first heat exchanger.

4. The information processing device according to claim 1, wherein the water from the water supply member evaporates in the evaporator when the discharged air passes through the evaporator.

5. The information processing device according to claim 1, wherein the water supply member includes: a water storage pan provided below the evaporator: and a flow channel configured to couple the receiving pan and the water storage pan.

6. The information processing device according to claim 5, wherein each of the plurality of capillaries includes one end which is immersed in the water of the water storage pan and the other end in which the water is evaporated from the pores when the discharged air passes in the evaporator.

7. The information processing device according to claim 1, further comprising:
   a second heat exchanger provided between the first heat exchanger and the one or more information processing device main bodies,
   wherein a refrigerant that passes through the first heat exchanger is supplied to the second heat exchanger.

8. The information processing device according to claim 7, wherein the air blower and the second heat exchanger are provided in the one or more information processing device main bodies.

9. The information processing device according to claim 1, further comprising:
   a second heat exchanger provided between the first heat exchanger and the one or more information processing device main bodies;
   a third heat exchanger provided between the one or more information processing device main bodies and the evaporator; and
   a pipeline configured to supply a portion of a first refrigerant from the first heat exchanger to the third heat exchanger, join a remaining portion of the first refrigerant from the first heat exchanger and a second refrigerant from the third heat exchanger together, and supply a joined refrigerant to the second heat exchanger.

10. The information processing device according to claim 1, wherein the first heat exchanger and the evaporator are provided for each of the one or more information processing device main bodies.

11. The information processing device according to claim 1, wherein the first heat exchanger and the evaporator are provided for the one or more information processing device main bodies.

12. A container for a data center, comprising:
   a plurality of information processing devices;
   a plurality of air blowers, each provided for each of the plurality of information processing devices, configured to introduce air into the respective information processing devices;
   a first heat exchanger configured to cool air to be introduced into the plurality of information processing devices;

an evaporator through which discharged air that is discharged from the plurality of information processing devices passes;

a receiving pan configured to receive water generated by dew condensation in the first heat exchanger; and a water supply member configured to supply the water in the receiving pan to the evaporator, the evaporator includes:

a water storage pan configured to receive the water from the receiving pan; and a plurality of capillaries configured to pump up water in the water storage pan by capillary action, each of the plurality of capillaries having a plurality of pores in a circumferential surface of the respective capillaries.

13. The container according to claim 12, wherein the plurality of information processing devices are servers.

14. The container according to claim 12, wherein each of the plurality of information processing devices includes a heat generating component configured to generate heat based on an operation.

15. The container according to claim 12, wherein cooling water at an environmental temperature or lower is supplied from a cooling water supply device to the first heat exchanger.

16. The container according to claim 12, wherein the water from the water supply member evaporates in the evaporator when the discharged air passes through the evaporator.

17. The container according to claim 12, wherein the water supply member includes:

a water storage pan provided below the evaporator; and a flow channel configured to couple the receiving pan and the water storage pan.

18. The container according to claim 17, wherein each of the plurality of capillaries includes one end which is immersed in the water of the water storage pan and the other end in which the water is evaporated from the pores when the discharged air passes in the evaporator.

19. The container according to claim 12, further comprising:

a second heat exchanger provided between the first heat exchanger and the plurality of information processing devices, wherein a refrigerant that passes through the first heat exchanger is supplied to the second heat exchanger.

20. The container according to claim 12, further comprising:

a second heat exchanger provided between the first heat exchanger and the plurality of information processing devices;

a third heat exchanger provided between the plurality of information processing devices and the evaporator; and a pipeline configured to supply a portion of a first refrigerant from the first heat exchanger to the third heat exchanger, join a remaining portion of the first refrigerant from the first heat exchanger and a second refrigerant from the third heat exchanger together, and supply a joined refrigerant to the second heat exchanger.

* * * * *